United States Patent [19]

Matsuyama et al.

[11] Patent Number: 4,799,087
[45] Date of Patent: Jan. 17, 1989

[54] FIELD EFFECT TRANSISTOR

[75] Inventors: Takao Matsuyama; Hisaki Tarui, both of Hirakata; Shinya Tsuda, Yawata; Shoichi Nakano, Hirakata; Yukinori Kuwano, Katano, all of Japan

[73] Assignee: Sanyo Electric Co., Ltd., Moriguchi, Japan

[21] Appl. No.: 72,180

[22] Filed: Jul. 10, 1987

[30] Foreign Application Priority Data

Jul. 22, 1986 [JP] Japan ................................ 61-172087

[51] Int. Cl.$^4$ ............................................. H01L 27/12
[52] U.S. Cl. ...................... 357/4; 357/23.4; 357/23.7; 357/2
[58] Field of Search ............... 357/4 SL, 23.4, 23.7, 357/2

[56] References Cited

U.S. PATENT DOCUMENTS 4,642,144  2/1987  Tiedje ........................ 357/4 SL

OTHER PUBLICATIONS

Drummond, *App. Phys. Lett*, 25 Aug. 1986, 49(8), p. 461.
Japanese Journal of Applied Physics, vol. 19, Nr. 5, May 1980, pp. L225-L227, A New Field-Effect Transistor with Selectively Doped GaAs/n-Al$_x$Ga$_{1-x}$As Heterojunctions by T. Mimura et al.

*Primary Examiner*—Martin H. Edlow
*Attorney, Agent, or Firm*—W. G. Fasse; D. H. Kane, Jr.

[57] ABSTRACT

A field effect transistor comprises a source electrode, a drain electrode, a channel layer between the source electrode and the drain electrode, a gate electrode for controlling electric current in the channel layer, and a superlattice layer interposed between the channel layer and the gate electrode, the superlattice layer having a plurality of constituent thin layers perpendicular to a direction of electric current in the channel layer.

5 Claims, 4 Drawing Sheets

1

FIELD EFFECT TRANSISTOR

BACKGROUND OF THE INVENTION

1. Field of the Invention

The present invention relates to a field effect transistor (FET) and particularly to a high electron mobility transistor (HEMT).

2. Description of the Prior Art

An HEMT is disclosed by T. Mimura et al. in Japanese Journal of Applied Physics Vol. 19, No. 5, May, 1980, pp. L225-L227. In this HEMT, a non-doped GaAs layer and an AlGaAs layer doped with Si are stacked on a semi-insulating GaAs substrate. The Si dopant is ionized by emitting electrons and acts as donor. The thus generated electrons are stored on the GaAs side of the heterogeneous interface between the AlGaAs layer and the GaAs layer because of a low energy level at the bottom of the conduction band of non-doped GaAs. The electrons thus stored two-dimensionally form a channel, which is controlled by gate voltage. In the HEMT, the non-doped GaAs channel layer and the carrier supply layer of AlGaAs doped with impurity are provided independently and, accordingly, even if density of carriers in the channel layer is increased by doping the carrier supply layer with a large amount of impurity, mobility of electrons is not lowered since the channel layer is not doped with impurity. Consequently, the HEMT is capable of performing high-speed operation.

SUMMARY OF THE INVENTION

A primary object of the present invention is to provide an FET having a new structure, by which density of carriers injected in a channel layer can be increased and the FET can perform operation at a higher speed.

The FET according to the present invention comprises: a source electrode; a drain electrode; a channel layer between the source electrode and the drain electrode; a gate electrode for controlling electric current in the channel layer; and a superlattice layer between the channel layer and the gate electrode, the superlattice layer including a plurality of constituent thin layers perpendicular to a direction of electric current in the channel layer.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
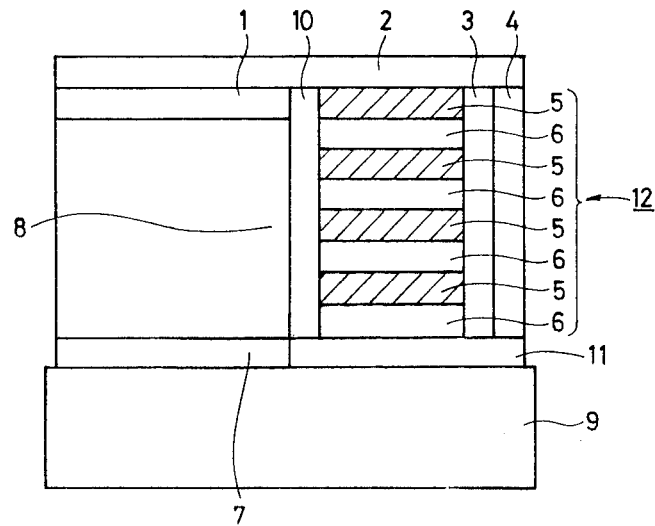
FIG. 1 is a schematic cross sectional view of an FET of an embodiment of the present invention.

Referring to FIG. 1, an FET of an embodiment of the present invention is illustrated by a schematic sectional view. A drain electrode 7, a channel layer 8 and a source electrode 1 are stacked in order on a left region of a major surface of an insulating substrate 9. Thus, this FET is of a vertical type. The channel layer 8 is formed of hydrogenated amorphous silicon (a-Si:H) to have a height of about 4000 Å. An insulating layer 11 of amorphous silicon oxide (a-SiO) is provided on a right region of the major surface of the substrate 9, adjacent to the drain electrode 7. A vertical layer 10 of hydrogenated amorphous silicon carbide (a-Si$_{1-x}$C$_x$:H) having a width of about 30 Å is provided on the insulating layer 11, adjacent to the channel layer 8. A superlattice layer 12 having a width of about 3 μm is provided adjacent to the vertical a-Si$_{1-x}$C$_x$:H layer 10 on the insulating layer 11. The superlattice layer 12 includes, as constituent thin layers, potential well layers 6 of a-Si:H and barrier layers 5 of n+a-Si$_{1-x}$C$_x$:H. Those potential well layers 6 and barrier layers 5 are stacked alternately, parallel to the major surface of the substrate 9. Adjacent to the superlattice layer 12, a layer 3 of a-Si$_{1-x}$C$_x$:H having a width of about 30 Å and a gate electrode 4 adjacent thereto are provided on the insulating layer 11. Upper end surfaces of those layers 1, 10, 12, 3, and 4 are covered with an insulating layer 2 of a-SiO.

In the thus structured FET, electrons generated in the superlattice layer 12 are stored in the potential well layers 6, so as to be quantized two-dimensional electrons. The two-dimensional electrons have high mobility in a direction parallel to the potential well layers 6 and those electrons are caused to tunnel through the a-Si$_{1-x}$C$_x$:H layer 10 by a voltage applied to the gate electrode 4, whereby they are injected into the channel layer side of the heterogeneous a-Si:H/a-Si$_{1-x}$C$_x$:H interface. The injected electrons are transported by a voltage applied between the source electrode 1 and the drain electrode 7.

Figure 2:
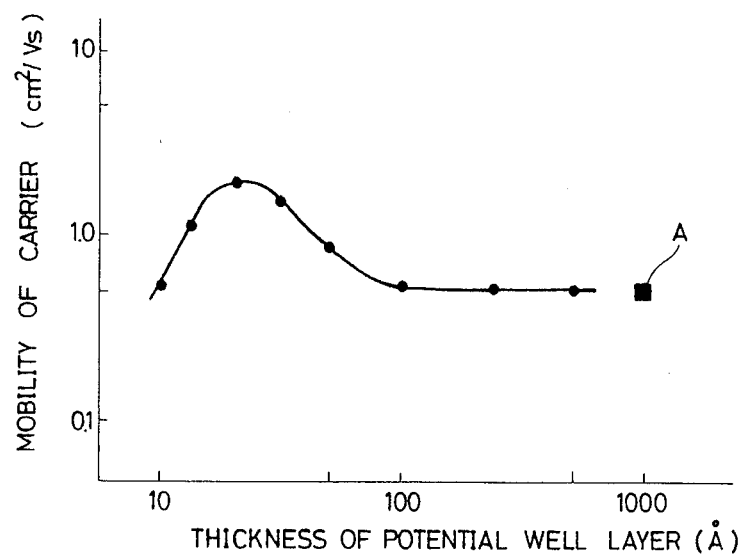
FIG. 2 is a graph showing the mobility of carriers with respect to the thickness of the potential well layer.

Referring to FIG. 2, the mobility of electrons is shown with respect to the thickness of each potential well layer 6. As can be seen from this figure, if the thickness of each potential well layer 6 is about 20 Å moblity of electrons is about four times that (shown as the point A) of a conventional HEMT.

Figure 3:
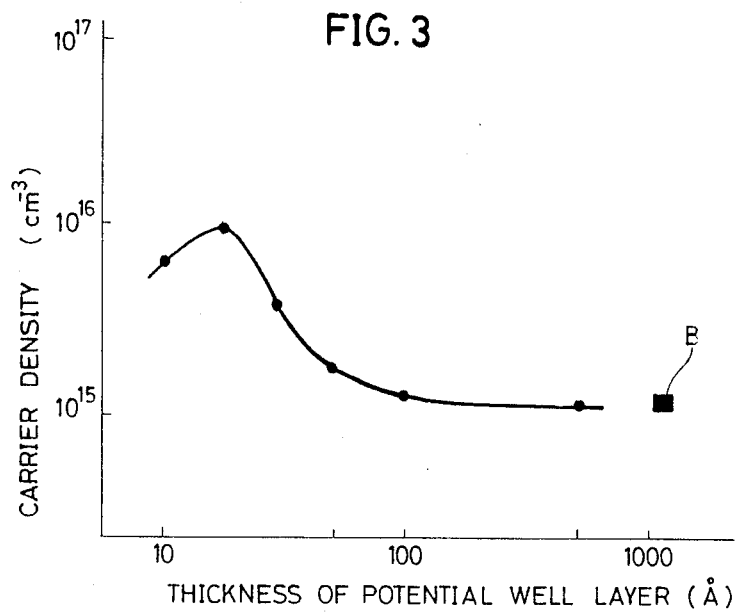
FIG. 3 is a graph showing the density of carriers injected in the channel layer with respect to the thickness of the potential well layer.

FIG. 3 shows the density of carriers injected into the channel layer 8 with respect to the thickness of each potential well layer 6. As can be seen from this figure, if the thickness of each potential well layer 6 is about 20 Å, the density of carriers is about ten times that (shown as the point B) of a conventional HEMT.

In addition, since the FET shown in FIG. 1 is of a vertical type, the channel length can be decreased to about 1000 Å.

As a result, the FET shown in FIG. 1 is capable of performing operation at a speed about ten times higher than that of a conventional HEMT. According to the present invention, even an FET of a horizontal type is capable of performing operation at a speed about four times higher than that of a conventional HEMT.

Although semiconductor material is used for the barrier layers 5 in the above described embodiment, if an insulating material such as a-SiN or a-SiO$_x$ is used for the barrier layers 5, a carrier confinement effect in the potential well layers 6 is further enhanced and the density of carriers injected in the channel layers is further increased.

Figure 4A:
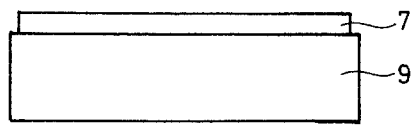
FIGS. 4A to 4J are sectional views illustrating a manufacturing process of the FET shown in FIG. 1.
Figure 4B:
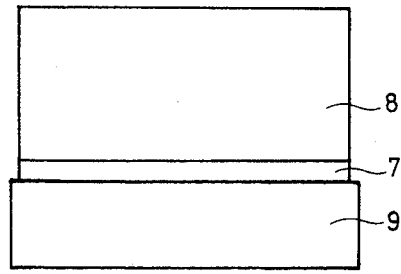
Figure 4C:
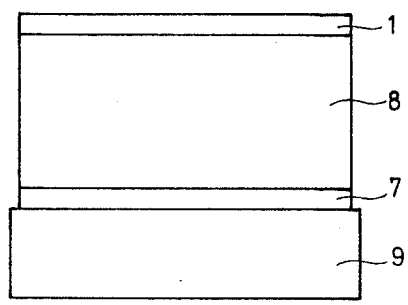
Figure 4D:
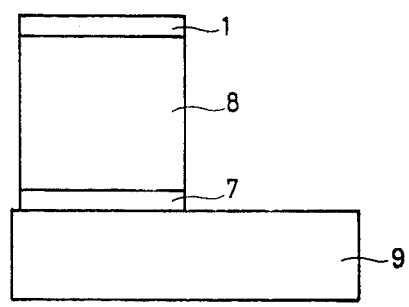
Figure 4E:
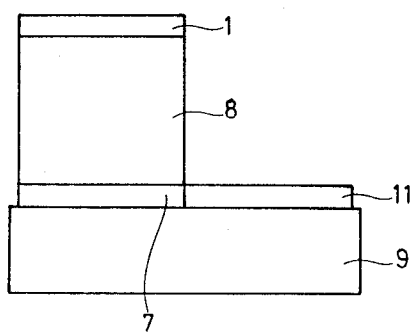
Figure 4F:
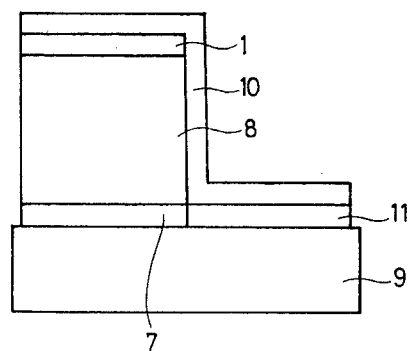
Figure 4G:
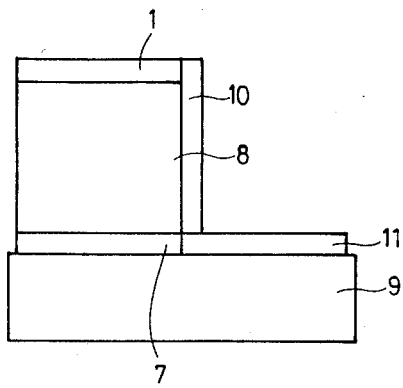
Figure 4H:
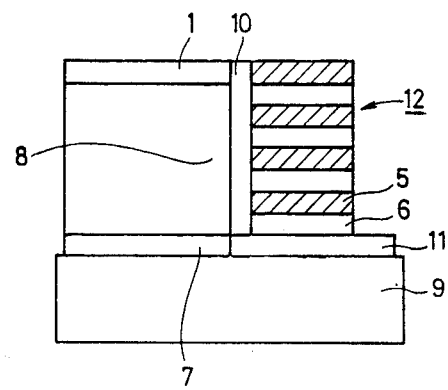
Figure 4I:
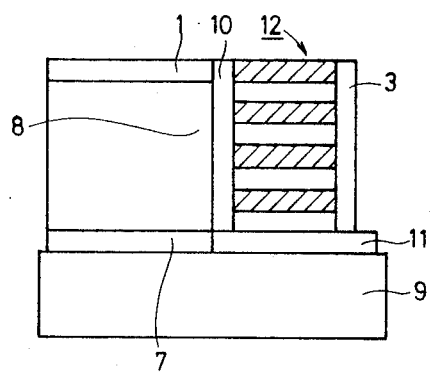
Figure 4J:
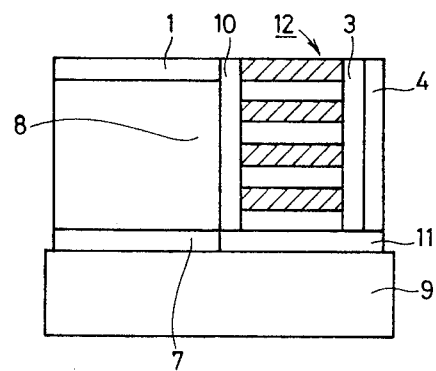

Referring now to FIGS. 4A to 4J, a manufacturing process of the FET shown in FIG. 1 will be described. First referring to FIG. 4A, a drain electrode 7 of Al, Au, polisilicon or the like is formed on the major surface of the substrate 9 of glass or the like. In FIG. 4B, a channel layer 8 of a-Si:H having a height of about 4000 Å is formed on the drain electrode 7 by a photo CVD method (with reaction conditions: $Si_2H_6$, 30SCCM, substrate temperature 200° C., reaction pressure 27 Pa) using a low-pressure mercury lamp (wavelength 184.9 nm, 10 mW/cm$^2$). In FIG. 4C, a source electrode 1 is formed on the channel layer 8. Subsequently, in FIG. 4D, right portions of the channel layer 8 and the electrodes 1 and 7 are removed by etching, so that a right region of the major surface of the substrate 9 is exposed. In FIG. 4E, on the exposed right region of the main surface of the substrate 9, an insulating layer 11 of a-SiO having a thickness of about 1000 Å is formed adjacent to the drain electrode 7 by a photo CVD method (with reaction conditions: $O_2/Si_2H_6 = 1$, 60SCCM, substrate temperature 200° C., reaction pressure 200 Pa). Referring to FIGS. 4F and 4E, a layer 10 of a-Si$_{1-x}$C$_x$:H having a width of about 30 Å and a height of about 4000 Å is formed on the insulating layer 11 and adjacent to the channel layer 8, by using the photo CVD method (with reaction conditions: $C_2H_2/Si_2H_6 = 0.07$, 220SCCM, substrate temperature 200° C., reaction pressure 150 Pa). In this step, as shown in FIG. 4F, the a-Si$_{1-x}$C$_x$:H layer 10 is first deposited with a nearly uniform thickness to cover the source electrode 1, a side surface of the channel layer 8 and the insulating layer 11 and then it is subjected to reactive ion etching from upside, whereby the vertical layer 10 is left as shown in FIG. 4G. In FIG. 4H, a superlattice layer 12 having a width of about 3 μm and a height of about 4000 Å is further formed on the insulating layer 11, adjacent to the a-Si$_{1-x}$C$_x$:H layer 10. In this step of forming the superlattice layer 12, a potential well layer 6 of a-Si:H having a thickness of about 20Å is first formed by using the photo CVD method (with reaction conditions: $Si_2H_6$, 30 SCCM, substrate temperature 200° C., reaction pressure 27Pa) and then a barrier layer 5 of n+ a-Si$_{1-x}$C$_x$:H having a thickness of about 15 Å is formed on the potential well layer 6 by using the photo CVD method (with reaction conditions: $C_2H_2/Si_2H_6 = 0.07$, $PH_3/(Si_2H_6 + C_2H_2) = 0.01$, 440SCCM, substrate temperature 200° C., reaction pressure 150 Pa). Potential well layers 6 and barrier layers 5 are deposited alternately so that they are stacked to have a total thickness of about 4000 Å. In FIG. 4I, a layer 3 of a-Si$_{1-x}$C$_x$:H having a width of about 30 Å and a height of about 4000 Å is formed adjacent to the superlattice layer 12 on the insulating layer 11 by using the photo CVD method (with reaction conditions: $C_2H_2/Si_2H_6 = 0.07$, 220SCCM, substrate temperature 200° C., reaction pressure 150 Pa). In FIG. 4J, a gate electrode 4 is formed adjacent to the layer 3. Finally, an insulating layer 2 of a-SiO having a thickness of about 1000 Å is formed on upper end surfaces of those layers 1, 10, 12, 3 and 4 by using the photo CVD method (with reaction conditions: $O_2/Si_2H_6 = 1$, 60SCCM, substrate temperature 200° C., reaction pressure 200 Pa), whereby the FET shown in FIG. 1 is completed.

The channel layer 8 may be formed of hydrogenated amorphous silicon germanium (a-Si$_{1-x}$Ge$_x$:H) or hydrogenated amorphous germanium (a-Ge:H) instead of a-Si:H.

As for the barrier layers 5 and the potential well layers 6, combinations of materials shown in Table I may be adopted.

TABLE I

| Barrier Layer | Potential Well Layer |
|---|---|
| a-Si$_{1-x}$C$_x$:H (Eg:2.0~3.0 eV) | a-Si:H (Eg:~1.7 eV) |
| | a-Si$_{1-x}$Ge$_x$:H (Eg:1.1~1.5 eV) |
| | a-Ge:H (Eg:~1.1 eV) |
| | μc-Si:H (Eg:~2.0 eV) |
| a-Si$_{1-x}$N$_x$:H (Eg:1.9~3.0 eV) | a-Si:H (Eg:~1.7 eV) |
| | a-Si$_{1-x}$Ge$_x$:H (Eg:1.1~1.5 eV) |
| | a-Ge:H (Eg:~1.1 eV) |
| | μc-Si:H (Eg:~2.0 eV) |
| μc-Si:H (Eg:~2.0 eV) | a-Si:H (Eg:~1.7 eV) |
| | a-Si$_{1-x}$Ge$_x$:H (Eg:1.1~1.5 eV) |
| | a-Ge:H (Eg:~1.1 eV) |
| a-SiN (Eg:3.0~6.0 eV) | a-Si:H (Eg:~1.7 eV) |
| | a-Si$_{1-x}$Ge$_x$:H (Eg:1.1~1.5 eV) |
| | a-Ge:H (Eg:~1.1 eV) |
| | a-Si$_{1-x}$N$_x$:H (Eg:1.9~2.5 eV) |
| | a-Si$_{1-x}$C$_x$:H (Eg:2.0~2.5 eV) |
| | μc-Si:H (Eg:~2.0 eV) |
| a-SiO$_x$ (Eg:3.0~6.0 eV) | a-Si:H (Eg:~1.7 eV) |
| | a-Si$_{1-x}$Ge$_x$:H (Eg:1.1~1.5 eV) |
| | a-Ge:H (Eg:~1.1 eV) |
| | a-Si$_{1-x}$N$_x$:H (Eg:1.9~2.5 eV) |
| | a-Si$_{1-x}$C$_x$:H (Eg:2.0~2.5 eV) |
| | μc-Si:H (Eg:~2.0 eV) |

The electron energy band gaps Eg of such materials as a-Si$_{1-x}$N$_x$:H and a-Si$_{1-x}$C$_x$:H can be controlled dependent on the contents of nitrogen and carbon. The band gap Eg of a-SiO$_x$ can be also controlled dependent on the content of oxygen.

The insulating layers 2 and 11 may be formed of amorphous silicon nitride (a-SiN) or the like instead of a —SiO and the layer 10 may be formed of hydrogenated amorphous silicon nitride (a-Si$_{1-x}$N$_x$:H), a-SiN, a-SiO$_x$ or the like instead of a-Si$_{1-x}$C$_x$:H.

Conditions (substrate temperature, reaction pressure, film thickness, flow rate, and composition of gas) for forming films of the above described materials constituting the FET of the present invention are shown in Table II. Since the barrier layers 5 in the superlattice layer 12 contain n type impurity, a doping amount and a flow rate for forming the barrier layers are shown in parentheses.

TABLE II

| Materials | Substrate Temperature (°C.) | Reaction Pressure (Pa) | Film Thickness (Å) | Flow Rate (SCCM) | Composition of Gas |
|---|---|---|---|---|---|
| a-Si:H | 200 | 27 | 4000 or 25 | 30 (60) | $Si_2H_6$ ($PH_3/Si_2H_6$ = 0.01) |
| a-Si$_{1-x}$Ge$_x$:H | 270 | 80 | 4000 or 25 | 10 (20) | $GeH_4/SiH_4$ = 0.2 $H_2/SiH_4$ = 1 ($PH_3/(SiH_4 + GeH_4)$) = 0.01 |
| a-Ge:H | 200 | 60 | 4000 or 25 | 10 (20) | $H_2/GeH_4$ = 1 ($PH_3/GeH_4$ = 0.01) |
| μc-Si:H | 300 | 40 | 25 | 200 | $H_2/Si_2H_6$ = 40 |

TABLE II-continued

| Materials | Substrate Temperature (°C.) | Reaction Pressure (Pa) | Film Thickness (A) | Flow Rate (SCCM) | Composition of Gas |
|---|---|---|---|---|---|
| a-Si$_{1-x}$N$_x$:H | 200 | 40 | 25 | (400) 90 | (PH$_3$/Si$_2$H$_6$ = 0.01) NH$_3$/Si$_2$H$_6$ = 0.2 |
| | | | ~30 | (180) | (PH$_3$/(Si$_2$H$_6$ + NH$_3$) = 0.01) |
| a-Si$_{1-x}$C$_x$:H | 200 | 150 | 25 | 220 | C$_2$H$_2$/Si$_2$H$_6$ = 0.07 |
| | | | ~30 | (440) | (PH$_3$/(Si$_2$H$_6$ + C$_2$H$_2$) = 0.01) |
| a-SiN | 200 | 100 | 30 | 60 | NH$_3$/Si$_2$H$_6$ = 0.5 |
| SiO$_2$ | 200 | 100 | 30 | 60 | O$_2$/Si$_2$H$_6$ = 1 |

Figure 5:
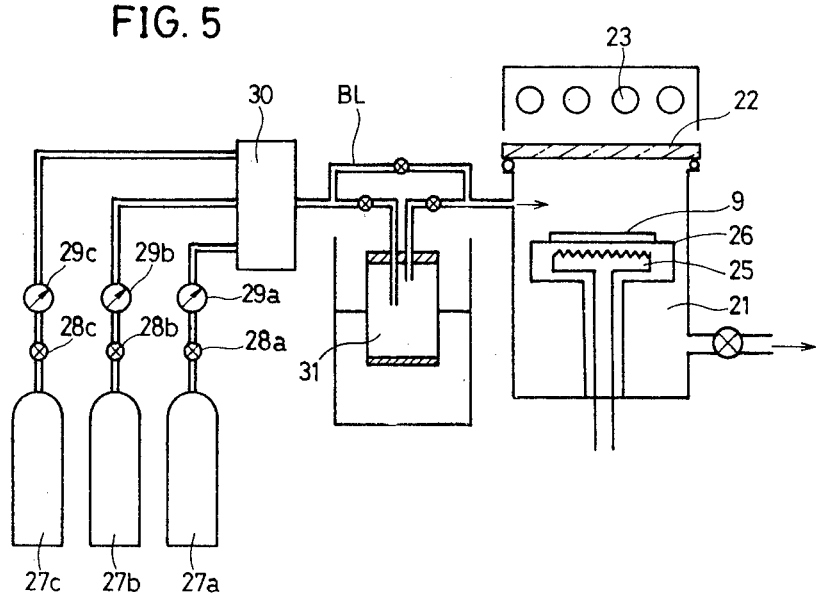
FIG. 5 is a conceptional view of a photo CVD device to be used for manufacturing of an FET of the present invention.

Referring to FIG. 5, a photo CVD device to be used for manufacturing the FET shown in FIG. 1 is illustrated schematically. A ceiling 22 of a reaction chamber 21 is made of transparent quartz plate. A light source 23 formed by low pressure mercury lamps radiating ultraviolet is provided above the quartz plate 22. The ultraviolet radiated from the light source 23 passes through the quartz plate 22 into the reaction chamber 21. In the reaction chamber 21, a substrate 9 is placed on a susceptor 26 containing a heater 25.

Source gases for a photo CVD are supplied from cylinders 27a, 27b and 27c through valves 28a, 28b and 28c and mass flow controllers 29a, 29b and 29c, respectively, to a gas selector 30. A source gas selected by the gas selector 30 is introduced into the reaction chamber 21 with mercury vapor serving as a sensitizer through a mercury reservoir 31 held at a prescribed temperature in the range from the room temperature to 80° C.

The method utilizing the mercury vapor is well known as a mercury sensitizing method. The mercury vapor is used for decomposing molecules which do not absorb the ultraviolet or which have low absorption efficiency. More specifically, the reaction gas is decomposed not directly by the ultraviolet but by collision of mercury atoms excited by the ultraviolet with molecules of the reaction gas.

In the case where mercury sensitizing is not required, the reaction gas is introduced into the reaction chamber 21 through a bypass line BL.

In the following, an example for forming potential well layers 6 of a-Si:H and barrier layers 5 of n+ a-Si$_{1-x}$C$_x$:H by using the photo CVD device shown in FIG. 5 will be described. First of all, the first gas cylinder 27a filled with gas of silane system such as SiH$_4$, Si$_2$H$_6$, Si$_3$H$_8$ or the like, the second gas cylinder 27b filled with gas containing carbon such as C$_2$H$_2$, SiH$_n$(CH$_3$)$_{4-n}$ (n=1, 2, 3 . . . ) or the like, the third gas cylinder 27c filled with PH$_3$ or the like are set. For convenience of explanation, it is assumed that: the first gas cylinder 27a is filled with Si$_2$H$_6$; the second gas cylinder 27b is filled with C$_2$H$_2$; and the third gas cylinder 27c is filled with PH$_3$.

Depending on whether a layer to be formed in the reaction chamber 21 is the a-Si:H layer 6 or the n+ a-Si$_{1-x}$C$_x$:H layer 5, the Si$_2$H$_6$ gas selected by the gas selector 30 or mixed gas obtained by adding C$_2$H$_2$ and PH$_3$ to the Si$_2$H$_6$ gas is introduced into the reaction chamber 21 through the mercury reservoir 31 held at the predetermined temperature. The flow rate and the composition of the source gases are controlled by the mass flow controllers 29a, 29b and 29c provided in the respective gas supply lines. The source gas introduced into the reaction chamber 21 is set to a prescribed pressure, and the substrate 9 is maintained at about 200° C. by a heater 25.

The reaction chamber 21 is evacuated by a rotary pump and a turbo molecular pump (not shown) or the like. First, in order to form a potential well layer 6 of about 25 Å in thickness, only the Si$_2$H$_6$ gas is selected by the gas selector 30 and introduced into the reaction chamber 21. The reaction gas in the reaction chamber 21 is irradiated for a prescribed period of time with ultraviolet of 10 mW/cm$^2$ having a wavelength of 1849 Å from the low pressure mercury lamp. After that, the supply of the source gas is stopped and the reaction chamber 21 is again evacuated by the rotary pump or the like. After the evacuation, a barrier layer 5 of about 15 Å in thickness is formed in the same manner as in the case of the potential well layer 6, by introducing the Si$_2$H$_6$+C$_2$H$_2$+PH$_3$ gas selected by the gas selector 30 into the reaction chamber 21. Thus, the step of forming the potential well layer 6 and the step of forming the barrier layer 5 are alternately repeated, whereby the superlattice layer 12 is formed.

Since the source gases Si$_2$H$_6$, C$_2$H$_2$ and PH$_3$ can be decomposed by ultraviolet without using a mercury sensitizing method, those source gases can be introduced directly into the reaction chamber 21 through the bypass line BL.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor comprising:
   a source electrode,
   a drain electrode,
   a channel layer between said source electrode and said drain electrode,
   a gate electrode for controlling electric current in said channel layer, and
   a superlattice layer between said channel layer and said gate electrode, said superlattice layer including a plurality of constituent thin layers perpendicular to a direction of electric current in said channel layer.

2. A field effect transistor in accordance with claim 1, wherein said drain electrode, said channel electrode and said source electrode are stacked in order on a major surface of an insulating substrate and said constituent thin layers of said superlattice layer are parallel to the major surface of said insulating substrate.

3. A field effect transistor in accordance with claim 1, wherein said superlattice layer includes constituent thin layers serving as potential well layers having a relatively small electron energy band gap and constituent thin layers serving as barrier layers having a relatively large electron energy band gap.

4. A field effect transistor in accordance with claim 3, wherein each of said potential well layers has a thickness of 10 to 1000 Å.

5. A field effect transistor in accordance with claim 4, wherein each of said potential well layers has a thickness of 10 to 100 Å.

* * * * *